(12) United States Patent
Erath (10) Patent No.: US 6,448,565 B1
(45) Date of Patent: Sep. 10, 2002

(54) UNIT FOR A PLASMA ATOMIZER DEVICE WITH PLASMA GAS-SUPPLY MEANS, SAMPLE ATOMIZER MEANS AND SAMPLE INJECTION MEANS

(75) Inventor: Michael Erath, Ueberlingen (DE)

(73) Assignee: Perkin Elmer Bodenseewerk GmbH (DE)

( * ) Notice: Subject to any disclaimer, the term of this patent is extended or adjusted under 35 U.S.C. 154(b) by 0 days.

(21) Appl. No.: 09/615,245

(22) Filed: Jul. 13, 2000

(30) Foreign Application Priority Data

Jul. 13, 1999 (DE) .......................... 198 32 630

(51) Int. Cl.⁷ ............................................... H01J 49/00
(52) U.S. Cl. .................................. 250/423 R; 250/288
(58) Field of Search .......................... 250/506.1, 423 R, 250/288; D24/127, 128, 110; D8/395, 396

(56) References Cited

U.S. PATENT DOCUMENTS

| 4,906,582 A | | 3/1990 | Fukui et al. | |
|---|---|---|---|---|
| 5,763,877 A | * | 6/1998 | Oishi et al. | 250/288 |
| 6,082,714 A | * | 7/2000 | Dornfest et al. | 261/142 |
| 6,210,485 B1 | * | 4/2001 | Zhao et al. | 118/724 |
| 6,258,170 B1 | * | 7/2001 | Somekh et al. | 118/715 |

FOREIGN PATENT DOCUMENTS

| DE | 3422946 A1 | 1/1986 |
|---|---|---|
| DE | 3620214 A1 | 12/1986 |
| DE | 4327497 A1 | 4/1995 |
| EP | 0542257 A2 | 5/1993 |
| EP | 0597221 A1 | 5/1994 |
| GB | 2203241 A | 10/1988 |

* cited by examiner

Primary Examiner—Kiet T. Nguyen
(74) Attorney, Agent, or Firm—St. Onge Steward Johnston & Reens LLC (57) ABSTRACT

The present invention relates to a unit for a plasma atomizer device comprising a supply means for supplying a gas for generating a plasma, an atomizer means for atomizing a sample to be analyzed, an injection means for injecting the atomized sample into a plasma generated with the supplied gas, and a support means for holding the supply means, the atomizer means and the injection means. The invention is characterized in that the support means is connectable to a generator chamber wall of the atomizer device in such a manner that the supply means and the injection means are arranged inside the generator chamber.

22 Claims, 5 Drawing Sheets

UNIT FOR A PLASMA ATOMIZER DEVICE WITH PLASMA GAS-SUPPLY MEANS, SAMPLE ATOMIZER MEANS AND SAMPLE INJECTION MEANS

FIELD OF THE INVENTION

The present invention relates to a unit for a plasma atomizer device with a supply means for supplying a gas for generating a plasma, an atomizer means for atomizing a sample to be analyzed, an injection means for injecting the atomized sample into a plasma generated with the supplied gas, and a support means for holding the supply means, the atomizer means and the injection means.

PRIOR ART

Figure 6:
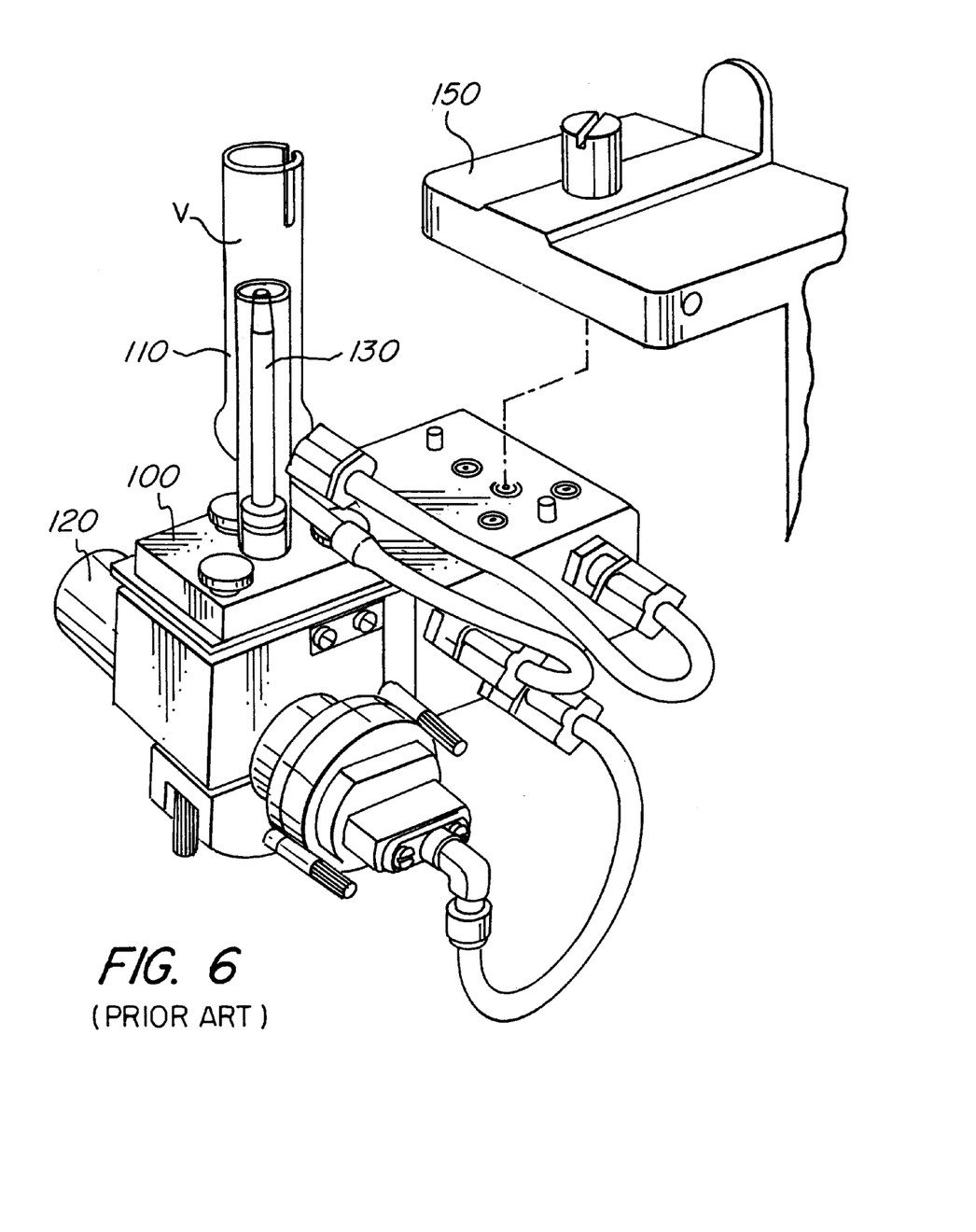
FIG. 6 shows a unit according to the prior art.

Such units are known in the prior art. FIG. 6 illustrates such a unit according to the prior art. Said unit comprises a supply means 110 for supplying a gas for producing a plasma in a volume V. The supply means 110 normally consists of two small quartz glass tubes that are arranged such that the gas required for generating the plasma can be supplied on the one hand and a gas required for cooling the supply means 110 can be supplied on the other hand. Furthermore, there are provided an atomizer means 120 for atomizing a sample to be analyzed and an injection means 130 for injecting the atomized sample into a plasma generated with the supplied gas in the volume V. The supply means 110, the atomizer means 120 and the injection means 130 are mounted within a support means 100.

For the operation of the plasma atomizer device, the whole unit as illustrated in FIG. 6 is arranged by means of a fastening means 150 in a generator chamber which accommodates an RF generator for igniting and maintaining the plasma (not shown).

The unit which is known from the prior art has the drawback that the supply means 110, the atomizer means 120 and/or the injection means 130 can only be cleaned or replaced under great efforts. In particular, the generator chamber must be opened; the unit must be detached from the fastening means 150 and removed from the generator chamber.

Another drawback of the prior-art unit is that the supply means 110 and the injection means 130 are fixedly arranged relative to each other. This has the effect that a cleaning of the supply means 110 and of the injection means 130 is rendered more difficult.

It is therefore the object of the present invention to improve the unit according to the prior art in such a manner that the individual components are rendered more easily accessible so that the efforts for cleaning or replacing the supply means, the atomizer means and the injection means are considerably reduced.

DESCRIPTION OF THE INVENTION

This object is achieved by a unit of the above-described type which is characterized by the feature that the support means is connectable to a generator chamber wall of the atomizer device in such a manner that the supply means and the injection means are arranged inside the generator chamber.

Since the support means is connectable to the generator chamber wall, the whole unit can easily be inserted into the generator chamber wall and can easily be detached for cleaning or replacing the supply means, the atomizer means and the injection means. It is thus no longer necessary to open the generator chamber entirely and to detach the unit from the fastening means for cleaning or replacing the components.

According to a preferred development of the above-described unit the support means may be designed such that the atomizer means is arranged outside the generator chamber.

As a result, the atomizer means is freely accessible in the installed state of the supply means and in the installed state of the injection means and can be exchanged without removal of the supply means or the injection means for the purpose of cleaning or replacement.

According to a preferred development of the above-described units, the support means may comprise a holding means to which the supply means, the atomizer means and the injection means can be fastened in a removable manner, as well as a closing means which is arranged to be rotatable relative to the holding means and by means of which the unit can be fixed to the generator wall.

This measure makes it possible to insert the holding means with the attached supply means, atomizer means and injection means into the generator chamber wall to prevent rotation, and to fixedly connect the whole unit to the generator chamber wall just by rotating the closing means. Thus the holding means can be inserted with the components attached thereto into the generator chamber wall at a predefined angular position.

Advantageously, the closing means may comprise at least one pin that can be brought into engagement with a bayonet curve provided in the generator wall. The closing means can thereby be opened and closed in a particularly fast and easy manner.

The closing means can particularly be formed by two pins that are engageable with two bayonet curves provided in the generator wall. Thanks to the provision of two pins that engage into two bayonet curves, it is possible to achieve a uniform distribution of the forces arising during the closing operation.

Advantageously, each pin may be provided with a roller. This leads to a decrease in the frictional force between pin and bayonet curve, whereby the closing means can be operated with less force on the one hand and a closing of the pin/pins and the bayonet curve/bayonet curves is avoided on the other hand.

As an alternative to a bayonet closure, the connection means may also comprise a thread that is engageable with a thread provided in the generator wall.

According to a preferred development of all of the above-described units, a stop means may be provided for limiting a rotation of the closing means in the closing direction relative to the holding means.

Since the rotation of the closing means, which is e.g. provided with a bayonet or thread means, is limited, a fixedly defined. mounting depth of the supply means and the injection means can be achieved in the generator chamber, particularly with respect to the RF generator means. A defined mounting depth can in particular optimize the formation of the plasma. Moreover, manufacturing tolerances of the individual elements can be compensated for.

The stop means may advantageously comprise an element which can be fixed in different positions on the closing means or the holding means, as well as an element which is fixedly arranged at the side of the holding means or the closing means and which can be stopped on the fixable element.

Thus various mounting depths of the supply means and the injection means in the generator chamber can be adjusted in advance and set by rotating the closing means until abutment without the need for a repeated adjustment of the desired mounting depth.

Advantageously, the element which can be fixed in different positions onto the closing means or the holding means may be made annular and may rotatably be arranged relative to the closing means or the holding means in a non-fixed position and may comprise a first control curve along which the element fixedly arranged at the side of the holding means or the closing means can be guided and at the end of which said element can be stopped. Said measure results in a low-maintenance unit which can be produced in a particularly easy manner and thus at low costs. The annular element can here be moved by hand into the desired stop position.

According to a particularly advantageous development of said unit the annular element may comprise a second control curve, and an element, which is connected to the closing means or the holding means, may be provided that can be guided in a first position along the second control curve and, in a second position, clamps the annular element against the closing means or the holding means. A fixing mechanism for the stop means can be realized by said measure in a simple and thus also inexpensive and maintenance-friendly way.

This design can advantageously be developed such that at the end at which the element which is fixedly arranged at the side of the holding means or closing means can be stopped, the first control curve comprises a snap-in mechanism into which the element connected to the holding means or closing means can be snapped, so that the annular element can be guided relative to the closing means or the holding means into a position in which the annular element can be clamped against the closing means or the holding means.

It is possible with said features to realize a mechanism by which the stop means and thus the mounting depth can be adjusted by just moving the closing means relative to the holding means. To be more specific, it is thus no longer necessary to provide a mechanism for moving the stop means into the different positions for the different mounting depths outside the closing means and the holding means. Furthermore, it can be ensured in the case of said design that after the removal of the unit for cleaning purposes or for replacing components the previously set mounting depth can exactly be adjusted again to the desired position after the cleaning process has been finished or after individual components have been replaced.

Said mechanism can be operated as follows, in particular in order to reproduce an adjusted mounting depth. (For the sake of simplicity it will be assumed in the following that the element which is guidable along the first control curve is fixedly connected to the holding means and the element which is guidable in its first position along the second control curve is connected to the closing means and, in its second position, clamps the annular element against the closing means.)

After the desired mounting depth has been set, the annular element which is fixed onto the closing means is released by the measure that the element which clamps the annular element to the closing means is moved into its first position. The holding element will then be rotated in the closing direction until the maximum mounting depth has been reached at which the element secured at the side of the holding means snaps into the snap-in means at the end of the first control curve. The annular element is thereby temporarily connected to the closing means. A rotation of the closing means into the original position will now have the effect that the annular element remains fixed relative to the holding means and assumes a stop position corresponding to the desired mounting depth relative to the closing means. A rotation of the closing means with respect to the opening direction for removing the unit will now have the effect that the element disengages from the snap-in mechanism and can be removed from the generator chamber wall in the end. When the unit is now inserted again and the closing means is rotated in the closing direction, said rotation will be limited by the element at the side of the holding means snapping into the snap-in means, i.e. by the originally set position corresponding to the mounting depth.

According to a preferred alternative to the above-described units the support means may comprise a means which can be engaged by at least one clip provided at the side of the generator wall. The unit can thereby be removed from and secured to the generator chamber wall very rapidly by opening or closing the clip provided at the side of the generator wall.

Preferably, the support means may comprise a means that is engagable by two clips provided at the side of the generator wall. A symmetrical distribution of the holding force over the unit is ensured by said measure.

According to an advantageous development of all of the previously described units the injection means may be provided on the support means to be fixable from the side of the support means that is facing away from the generator chamber. It is thereby possible to remove the injection means independently of the support means and the supply means for cleaning purposes or for the purpose of replacement.

A particularly advantageous development consists in that the support means is provided with a locking mechanism by which the injection means can be locked to the support means. Such a measure can implement a simple, but nevertheless operationally reliable, fastening means, which in addition can be operated without wasting time.

Advantageously, the locking mechanism may comprise a slide means which is displaceable in a displacement direction extending at an angle relative to the longitudinal axis of the injection means, the slide means comprising an opening through which the injection means can be guided, and the slide means being preloaded relative to the support means in such a manner that in the installed state of the injection means said means is clamped in the displacement direction against the support means.

Expediently, but not limited to such a design, the slide means may be displaceable in a displacement direction extending in a direction perpendicular to the longitudinal axis of the injection means.

According to a further advantageous development of all of the above-described units, the support means may comprise a clip means for fastening the atomizer means to the support means. Such a clip means permits a very fast replacement of the atomizer means, without the support means with the supply means and the injection means having to be removed from the generator wall.

Advantageously, the clip means may here be designed such that the atomizer means can be secured in a first position to the support means and fixed in a second position to the support means.

The clip means is expediently shaped in the form of a bow whose shape is adapted to the cross section of the atomizer chamber of the atomizer means. An easy operability is thereby ensured on the one hand and a perfect function of the fastening means on the other hand.

According to a preferred development of the units with the clip means, the support means may comprise an ejection means for facilitating a removal of the atomizer means from the support means. Such an ejection means is of particular advantage during prolonged operation of the unit because in such a case the sealing rings often get stuck between atomizer chamber and holding means, and such an ejection means considerably simplifies the removal in the case of seals that have got stuck.

Expediently, in units provided with both an ejection means and a clip means, the two means may be made integral. The constructional efforts for the unit are thereby reduced, resulting in reduced production costs. Moreover, the atomizer chamber can be removed with a handle, i.e. after the complete opening of the clip means.

Figure 1:
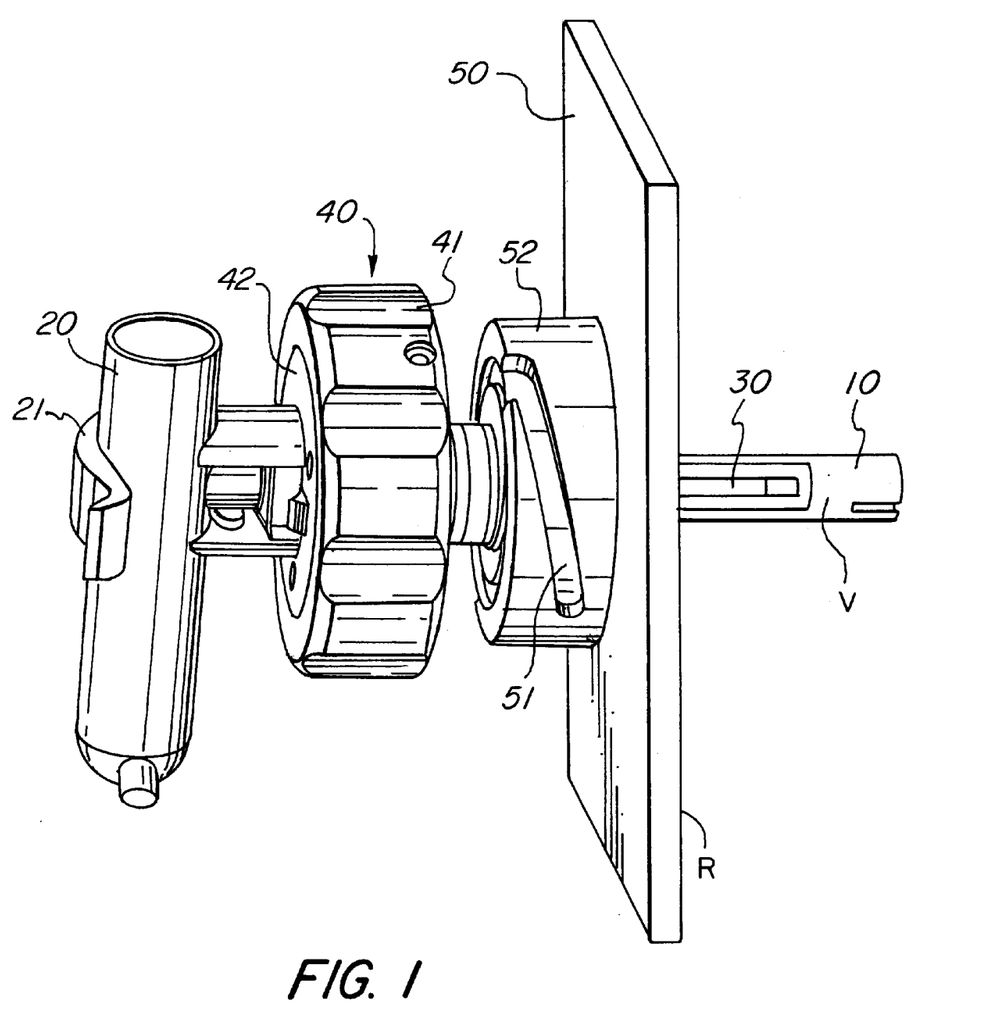
FIG. 1 is an oblique view showing an embodiment of a unit according to the present invention.

The present invention shall now be explained and described in more detail with reference to embodiments taken in conjunction with the attached drawing, in which:

FIG. 1 is an oblique view showing an embodiment of a unit for a plasma atomizer device according to the present invention.

Said unit comprises a supply means 10 for supplying a gas for generating plasma. As already discussed in connection with the prior art in FIG. 6, the supply means 10 normally consists of two small quartz glass tubes that are arranged such that the gas required for producing the plasma can be supplied on the one hand and the auxiliary gas required for cooling the supply means 10 can be supplied on the other hand. As is known from the prior art, such an auxiliary gas must be supplied for preventing a melting of the quartz glass tubes by the plasma.

Furthermore, the unit shown in FIG. 1 comprises an atomizer means 20 for atomizing a sample to be analyzed. For reasons of a simple illustration, there is only shown the chamber of the atomizer means. For putting the unit into operation, and by analogy with FIG. 6, an atomizer chamber head which is provided with corresponding nozzles, which are known from the prior art for the supply of an atomizer gas, and with the sample to be analyzed is mounted on the chamber shown in FIG. 1.

Furthermore, the unit according to the invention comprises an injection means 30 for injecting the sample to be atomized by the atomizer means 20 into the plasma generated with the gas supplied. Such atomizer means are also known from the prior art and are preferably made of quartz glass or ceramics.

The supply means 10, the atomizer means 20, and the injection means 30 are held on a support means 40.

The support means 40 is here configured such that it can be connected to a generator chamber wall 50 of the atomizer means, which is sectionwise shown in FIG. 1, the supply means 10 and the injection means 30 being arranged within the generator chamber R when the support means 40 is mounted on the generator chamber wall 50. In the generator chamber R, the supply means 10 and the injection means 30 are positioned such that a plasma can be ignited and maintained by means of an RF generator (not shown) in the volume V.

As will be described in detail further below, the mounting depth of the supply means 10 and the injection means 30 in the generator chamber R is adjustable in the embodiment illustrated in FIG. 1. As a result, the supply means 10 and the injection means 30 can be positioned in an optimum manner relative to the RF generator arranged in the generator chamber R. Moreover, manufacturing tolerances of the individual components can also be compensated in the axial direction.

In the embodiment shown in FIG. 1, the support means 40 is designed such that the atomizer means 20 is arranged outside the generator chamber.

In the illustrated embodiment the support means 40 comprises a holding means 42 which has secured thereto the supply means 10, the atomizer means 20 and the injection means 30, as well as a closing means 41 provided to be rotatable relative to the holding means 42. The unit can be fixed to the generator wall 50 by said closing means 41.

To this end the closing means 41 comprises two pins 43 (shown in detail in particular in FIG. 2) that can be brought into engagement with two bayonet curves 51 that are provided in an attachment 52 connected to the generator wall 50.

Figure 2:
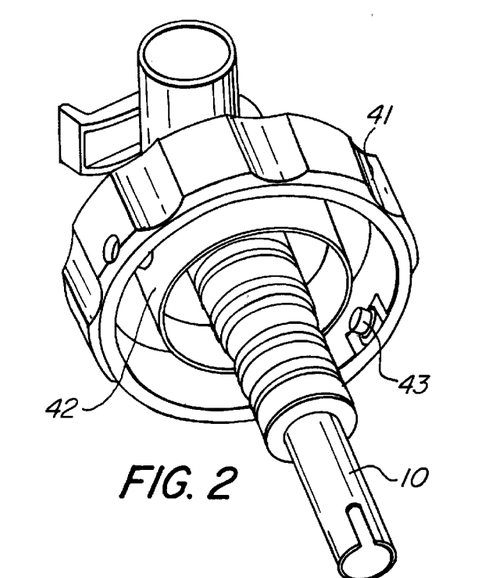
FIG. 2 is a detail view showing the closing means of the embodiment shown in FIG. 1.

Each pin may comprise a roller for reducing the friction of the pins 43.

For mounting the unit shown in FIG. 1, the holding means 42 is first secured to the generator chamber wall 50 to prevent rotation. The supply means 10 and the injection means 30 are here passing into the generator chamber through an opening in the generator wall 50 and the attachment 52. As is particularly shown in FIGS. 1, 2, 5a and 5b, the holding means 42, the supply means 10 and the injection means 30 comprise a number of seals to ensure that neither the atomized sample nor the gases required for generating the plasma and for cooling the supply means 10 exit in an undesired manner.

After the holding means 42 has been secured to the generator wall to prevent rotation, the pins 43 are in engagement with the bayonet curves 51. Finally the entire unit can be fixed to the generator chamber wall 50 by rotating the closing means 41, i.e. clockwise in the illustrated embodiment.

Since the holding means 42 is arranged to be only rotatable relative to the closing Means 41 and is not axially displaceable, the degree of rotation of the closing means 41 relative to the holding means 42 determines the mounting depth of the supply means 10 and the injection means 30. Hence, the mounting depth of the supply means 10 and the injection means 30 can be defined by a stronger or weaker closing operation, i.e. change in the angle of the closing means 41 relative to the holding means 42.

Expediently, a scale and a marking for reading the scale may here be provided on the holding means 42 and the closing means 41, or the closing means 41 and the holding means 42, respectively, so that the mounting depth can directly be read on the scale.

Figure 3:
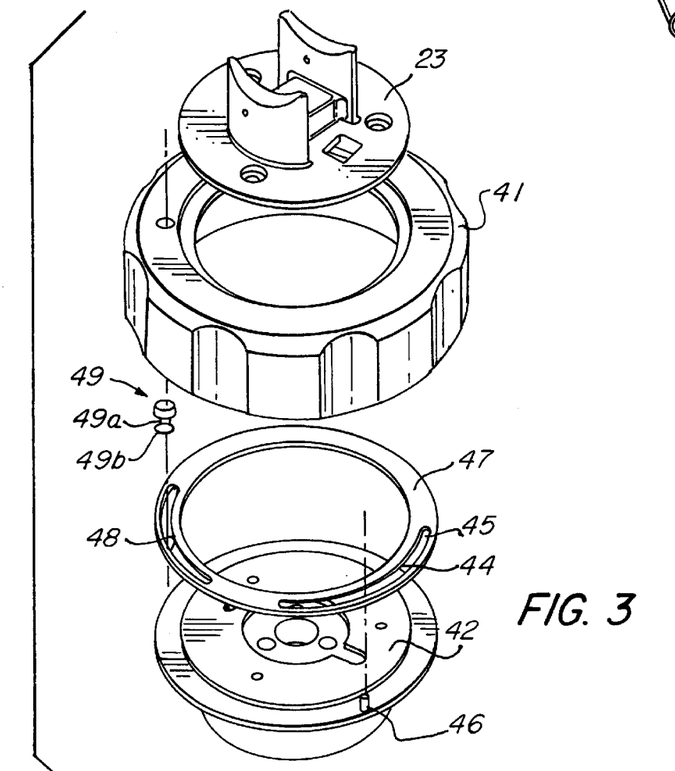
FIG. 3 is an exploded view showing the holding means and the closing means of the embodiment shown in FIG. 1.

The fact that the mounting depth of the supply means 10 and the injection means 30 correlates with the rotary position of the closing means 41 is also exploited in the mechanism illustrated in the exploded view of FIG. 3, whereby it is possible to bring the unit after a removal for cleaning purposes or for replacing individual components in an easy manner into a defined mounting depth set prior to the removal.

To this end a stop means is provided in the form of an annular element 47 by which a rotation extending in the closing direction (clockwise in the illustrated embodiment) is limited.

Said annular element is arranged between the holding means 42 and the closing means 41 and comprises a first control curve 44 and a second control curve 48.

The first control curve 44 is engaged by a pin 46 firmly connected to the holding means. Said pin is movable along the control curve 44. A snap-in mechanism into which the pin 46 can snap for abutment is provided at the end 45 of the control curve 44 that is positioned at the side of the opening direction.

The second control curve 48 is engaged by an element 49 which is secured to the dosing means 41 in such a manner that an axial movement is only possible relative to the closing means 41. Such an axial displacement can e.g. be achieved in that the element 49 is secured to the closing means 41 by means of a screw and can be moved upwards and downwards by operating the screw in FIG. 3 accordingly. Furthermore, the element 49 comprises a thinner section 49a which is movable in the control curve, and an enlarged section 49b which in the installed state comes to rest below the annular element 47, and the dimension of which in the widthwise direction of the control curve 48 is greater than that of the control curve.

Thanks to such a structure the element 49 can be brought by a corresponding operation of the fastening means on the closing means 41 into a first position in which it can be guided along the second control curve 48, and it can be brought into a second position in which the annular element 47 is clamped against the closing means 41.

The following description shows that a defined and set mounting depth can be reproduced with said mechanism.

After the desired mounting depth has been set, the annular element 47 which has been fixed to the closing means is released by bringing the element 49 into its first position, i.e., the element 49 is freely movable along the control curve 48. The holding means will then be rotated in the closing direction until the element 49 abuts on the control curve 44. After abutment the closing means 41 will be rotated in the closing direction until the maximum mounting depth has been reached. Since the element 49 is in abutment with the annular element 47, the annular element 47 will be guided therealong until the pin 46, which is fastened at the side of the holding means 45, snaps into the snap-in means 45 at the end of the first control curve 44 when the maximum mounting depth has been reached.

A return rotation of the closing means 41 into the original position, i.e. the position corresponding to the desired mounting depth will have the effect that the annular element 47, as it is freely movable in the second control curve 48 in the opening direction on the one hand and is temporarily fixed by the snap-in means 45 relative to the holding means 42 on the other hand, is brought with respect to the closing element 41 into a position which represents a stop or abutment for the desired mounting depth. In said position the annular element 47 is clamped with the element 49 against the closing means 41.

A rotation of the closing means 41 with respect to the opening direction for removing the unit will now have the effect that the pin 46 provided at the side of the holding means snaps out of the snap-in mechanism 45, passing through the control curve 44 up to the other end thereof. Finally, the unit can be removed from the generator chamber wall 50 by way of a movement extending in a direction perpendicular to the generator chamber wall 50.

When the unit is now inserted again after cleaning or after replacement of the components and when the closing means 41 is rotated in the closing direction, said rotation will be limited by the measure that the element 46 which is provided at the side of the holding means snaps into the snap-in means 45, or in other words, by the rotational position corresponding to the desired mounting depth.

The adjustment of the closing means 41 to the desired mounting depth can here be facilitated by a scale provided on the closing means 41 and by a pointer fixedly provided relative to the holding device 42 (e.g. on the element 23 connected to the holding element 42). Of course, it is also possible to provide the scale on the element 23 and the pointer on the closing means 41.

The first control curve 44 and the second control curve 48 are dimensioned such that the rotational range defined by the desired mounting depth range can be adjusted by the second control curve 48, and the first control curve 44 determines the rotational range which is defined by the rotational angle between changing position and the rotational angle corresponding to the maximum mounting depth.

Figure 4A:
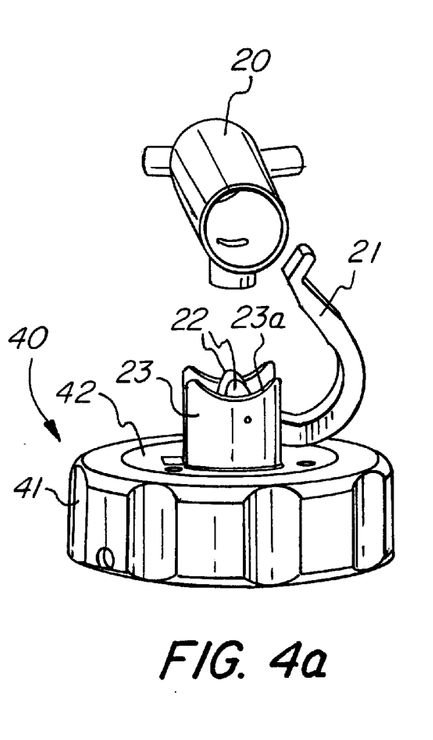
FIGS. 4a to 4c are views showing the clip means for fastening and fixing the atomizer means of the embodiment shown in FIG. 1.
Figure 4B:
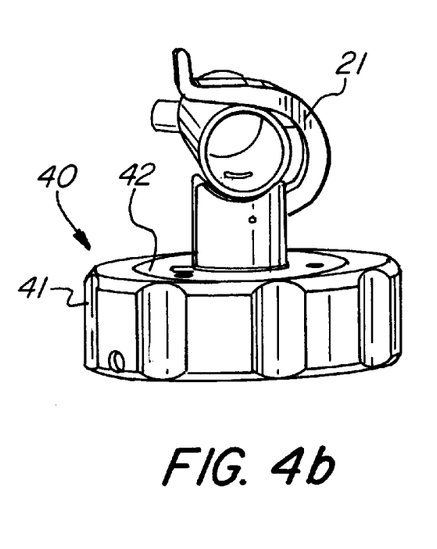
Figure 4C:
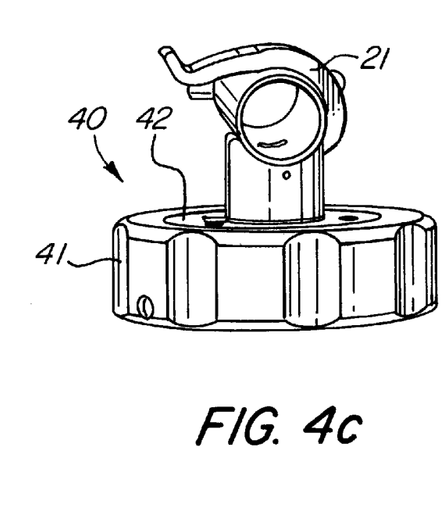

FIGS. 4a, 4b and 4c are views showing a clip means 21 for fastening and fixing the atomizer means 20. The clip means 21 is here supported on a holding element 23, which is fixedly connected to the holding means 42, to be rotatable about an axis 24 which is located in a plane extending substantially in parallel with the closing means 41 and the holding means 42.

The holding element 23 comprises support surfaces 23a that comply with the shape of the chamber of the atomizer means 20. In the installed state the chamber of the atomizer means 20 comes to rest in a positive manner on said support surfaces 23a. In the illustrated embodiment, the clip means 21 is shaped in the manner of a bow so that the chamber can be secured in a first position (see FIG. 4b) to the support means and, finally, can firmly be fixed by a further closing operation in a second position (see FIG. 4c) to the support means 40.

Furthermore, the clip means comprises an ejection means 22 for facilitating the removal of the atomizer means 20 from the support means 40. In particular after a long operation of the unit this is of advantage because it often happens that the sealing rings provided between atomizer chamber and holding means or between atomizer chamber and injection means get stuck, and consequently it often happens that the atomizer chamber can only be removed by the application of very great forces.

Figure 5A:
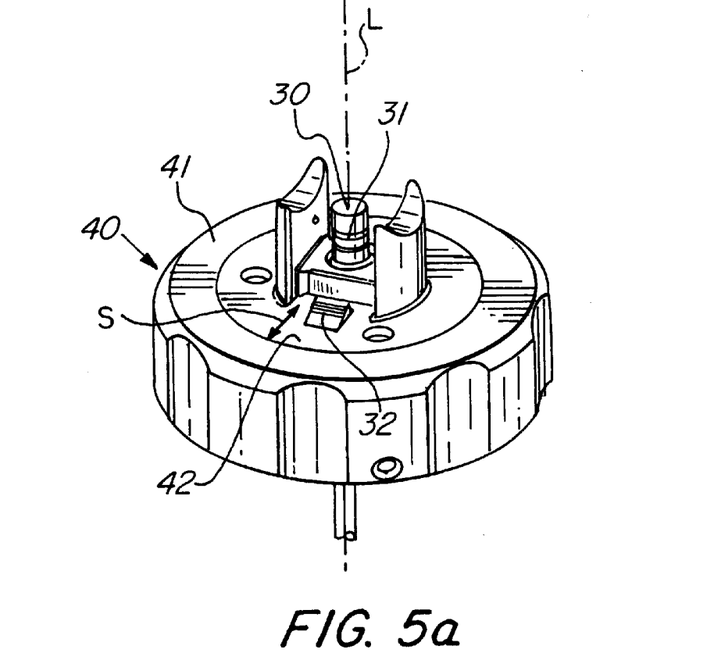
FIGS. 5a to 5b are views showing the locking means for locking the injection means of the embodiment shown in FIG. 1.
Figure 5B:
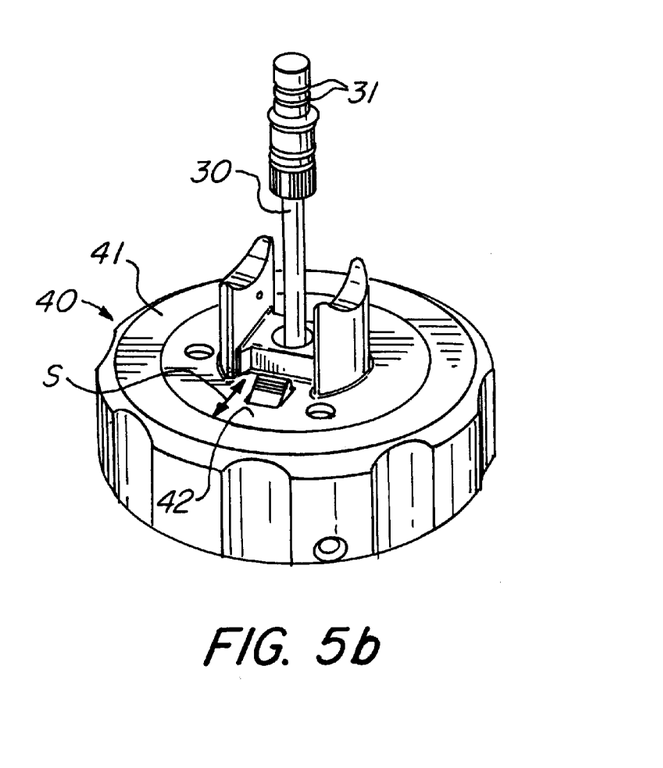

FIGS. 5a and 5b show a fastening means for the injection means 30 on the support means 40 in the form of a locking mechanism 32.

The locking mechanism 32 comprises a slide means which is displaceable in a displacement direction S extending at a vertical angle relative to the longitudinal direction of the injection means 30. The slide means comprises an opening through which the injection means 30 can be guided, the opening being thus made at least slightly greater than the cross section of the injection means. Furthermore, the slide means is preloaded relative to the holding means 42 in such a manner that in the inserted state of the injection means 30 it clamps said injection means in the displacement direction S with respect to the holding means 42.

The sample entry opening into the injection means 30 is advantageously designed in the illustrated embodiment such that it directly interacts with the exit opening of the injection means 20. Thus the atomizer chamber of the atomizer means 30 can directly be mounted on the injection means 30 and secured to the clip means 21 accordingly.

The present invention has been described with reference to a specific embodiment. Apart from said embodiment many further variations or modifications of said embodiment are possible.

In particular, the illustrated embodiment covers a special advantageous design of a support means, a special design of a stop means, a special design of a fastening means for the injection means and of a fastening means for the atomizer means. Of course, said special designs can each be used independently of one another and in any desired combinations with one another.

Moreover, many embodiments are possible in which the individual components differ from the ones described above.

For instance, the atomizer device may be provided on the support means in such a manner that it is arranged inside the generator chamber.

In another embodiment the closing means is only provided with a single pin which can be brought into engagement with a bayonet curve provided in the generator wall.

Alternatively, in a further embodiment the closing means is provided with a thread that can be brought into engagement with a corresponding thread provided in the generator wall.

Since in a thread the rotational position is also directly related with the mounting depth, such an embodiment may also be provided with a stop means by which a rotation of the closing means in the closing direction is limited with respect to the holding means.

The special design of the stop means according to FIG. 3 can also be modified in many ways.

According to a further embodiment the kinematics of the mechanism shown in FIG. 3 is reversed.

According to a further embodiment either the closing means 41 or the holding means 42 comprise a stop means in which an element fixedly arranged at the side of the holding means or the closing means is stopped when a predetermined rotational angle of the closing means relative to the holding means has been reached.

Said stop means may be provided such that only a specific installation depth is limited by the stop, or alternatively it may be designed such that it can be fixed in different positions for changing the rotational angle of the closing means relative to the holding means and thus for changing the mounting depth.

According to another embodiment the annular element between the holding means and the closing means can be adjusted from the outside. In this case the annular element need only comprise a first control curve in which a pin provided at the side of the holding means can be stopped.

According to a further embodiment the support means comprises only one holding means which can be engaged by a clip provided at the side of the generator wall. In this embodiment the unit is inserted into the generator wall to prevent rotation and is fixed to the generator wall by closing the clip.

In the embodiment that has been described above with reference to the figures, the injection means can be fastened from the side of the support means that is facing away from the generator wall. This has the advantage that the injection means can be replaced without requiring a removal of the support means and the supply means. Whenever such an advantage can be dispensed with, it is of course also possible to fasten the injection means to the support means from the side of the support means that is facing the generator chamber.

Apart from the locking mechanism described with reference to FIGS. 5*a* and 5*b*, it is possible to use many other fastening mechanisms for the injection means.

For instance, the injection means can also be secured to the support means by way of a thread or bayonet connection. To ensure a defined distance of the tip of the injection means from the support means, it makes sense in such a case to provide a stop mechanism for the injection means as well.

The clip means shown in FIGS. 4*a* to 4*c* can also be modified in many ways.

For instance, the ejection means need not be made integral with the clip means. Rather, an additional injection means may be provided in the form of a lever the operation of which will effect a vertical movement of the atomizer means relative to the support means.

What is claimed is:

1. A unit for a plasma atomizer device comprising:
   a generator chamber, having a chamber wall;
   a supply of gas for generating plasma;
   an atomizer for atomizing a sample to be analyzed;

an injector for injecting the atomized sample into a plasma generated with the supplied gas; and a support, detachably connected to the generator chamber wall, for holding the gas supply and the injector within the chamber and for holding the atomizer outside the chamber.

2. The unit according to claim 1, wherein the support comprises a holder to which the gas supply, the atomizer and the injector are fastened in a removable manner, and a connector that is rotatable relative to the holder for attaching the unit to the generator chamber wall.

3. The unit according to claims 2, wherein the connector comprises at least one pin which can be brought into engagement with a bayonet curve provided in the generator chamber wall.

4. The unit according to claim 3, wherein the connector comprises two pins that can be brought into engagement with two bayonet curves provided in the generator chamber wall.

5. The unit according to claim 3, wherein each pin comprises a roller.

6. The unit according to claim 2, wherein the connector comprises a thread which can be brought into engagement with a thread provided in the generator chamber wall.

7. The unit according to claim 2, wherein a stop is provided by which the rotation of the connector is limited relative to the holder.

8. The unit according to claim 7, wherein the stop comprises an adjustable annular element variably attached to the connector or the holder, and an element that is adjustably arranged at the side of the holder or the connector and can be stopped on the adjustable annular element.

9. The unit according to claim 8, wherein the adjustable annular element variably attached to the connector or the holder is rotatably arranged in a non-fixed position relative to the connector or the holder and comprises a first control curve along which the element adjustably arranged at the side of the holder or the connector can be guided, and at the end of which said element can be stopped.

10. The unit according to claim 9, wherein the annular element comprises a second control curve, and an element is provided that is connected to the connector or the holder and can be guided in a first position along the second control curve and, in a second position, clamps the annular element against the connector or the holder.

11. The unit according to claim 10, wherein at the end at which the element adjustably arranged at the side of the holder or the connector can be stopped, the first control curve comprises a snap-in mechanism that the element can be snapped into that is connected to the holder or the connector, so that the adjustable annular element can be guided relative to the connector or the holder into a position in which the adjustable annular element can be clamped against the connector or the holder.

12. The unit according to claim 1, wherein the support comprises a surface which can be engaged by at least one clip provided at the side of the generator wall.

13. The unit according to claim 12, wherein the support comprises a surface which can be engaged by two clips provided at the side of the generator chamber wall.

14. The unit according to claim 1, wherein the injector can be fastened to the support from a side of the support that is facing away from the generator chamber.

15. The unit according to claim 14, wherein the support comprises a locking mechanism by which the injector can be locked to the support.

16. The unit according to claim 15, wherein the locking mechanism comprises a slide which is displaceable into a displacement direction extending at an angle relative to a longitudinal axis of the injector, the slide comprising an opening which the injector can be passed though, and the slide being preloaded relative to the support in such a manner that in an inserted state of the injector it is clamped in the displacement direction with respect to the support.

17. The unit according to claim 16, wherein the slide is displaceable in a displacement direction which extends in a direction perpendicular to a longitudinal direction of the injector.

18. The unit according to claim 1, wherein the support comprises a clip for fastening the atomizer to the support.

19. The unit according to claim 18, wherein the clip is designed such that the atomizer can be fastened in a first position to the support and can be fixed in a second position to the support.

20. The unit according to claim 18, wherein the clip is shaped in the form of a bow whose shape is adapted to a cross section of an atomizer chamber.

21. The unit according to claim 18, wherein the support comprises an ejector for facilitating a removal of the atomizer from the support.

22. The unit according to claim 21, wherein the ejector and the clip are made integral.

* * * * *

UNITED STATES PATENT AND TRADEMARK OFFICE
CERTIFICATE OF CORRECTION

PATENT NO.     : 6,448,565 B1
DATED          : September 10, 2002
INVENTOR(S)    : Michael Erath It is certified that error appears in the above-identified patent and that said Letters Patent is hereby corrected as shown below:

<u>Title page,</u>
Item [30], Foreign Application Priority Data, "198 32 630" should read
-- 199 32 630.4 --

Signed and Sealed this

Twenty-ninth Day of April, 2003

JAMES E. ROGAN
*Director of the United States Patent and Trademark Office*